United States Patent [19]

Nishimura et al.

[11] Patent Number: 4,781,945

[45] Date of Patent: Nov. 1, 1988

[54] PROCESS FOR THE FORMATION OF PHOSPHOSILICATE GLASS COATING

[75] Inventors: Masahide Nishimura, Kawasaki; Kanetake Takasaki, Tokyo; Kenji Koyama, Yokohama; Atsuhiro Tsukune, Kawasaki, all of Japan

[73] Assignee: Fujitsu Limited, Kawasaki, Japan

[21] Appl. No.: 65,505

[22] Filed: Jun. 23, 1987

[30] Foreign Application Priority Data

Jun. 23, 1986 [JP] Japan ................................. 61-144919

[51] Int. Cl.⁴ .............................................. C23C 16/30
[52] U.S. Cl. ................................... 427/255.3; 427/99; 437/235; 437/240
[58] Field of Search ................. 427/255.3, 255, 99; 437/235, 240

[56] References Cited

U.S. PATENT DOCUMENTS

| | | | |
|---|---|---|---|
| 4,178,877 | 12/1979 | Kudo | 118/728 |
| 4,282,270 | 8/1981 | Nozaki et al. | 427/255.3 |
| 4,451,969 | 6/1984 | Chaudhuri | 427/74 |
| 4,513,026 | 4/1985 | Miyamoto et al. | 427/255.3 |

*Primary Examiner*—Sadie Childs
*Attorney, Agent, or Firm*—Staas & Halsey

[57] ABSTRACT

A coating of phosphosilicate glass is deposited on a substrate by a chemical vapor deposition method, using a reaction gas consisting of monosilane, phosphine, and oxygen, in admixture with ammonia gas. According to this deposition process, the undesirable formation and adhesion of particulate by-products such as $SiO_2$, $P_2O_5$, and $H_2SiO_3$ to the substrate surface can be effectively prevented, and the step coverage can be improved.

12 Claims, 5 Drawing Sheets

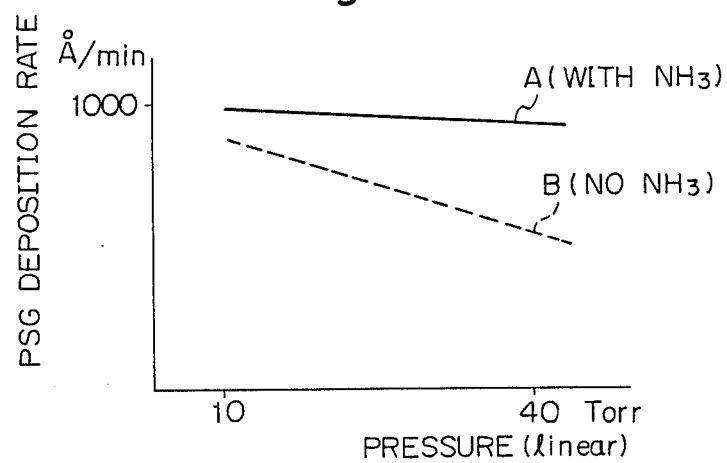
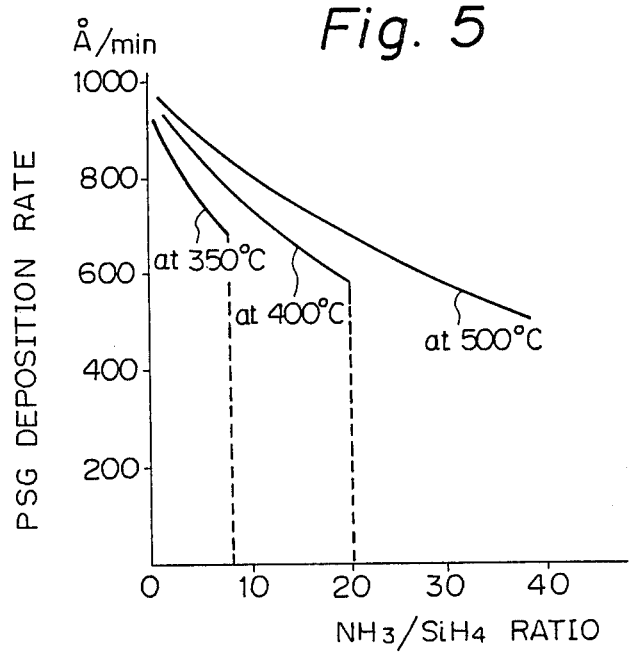

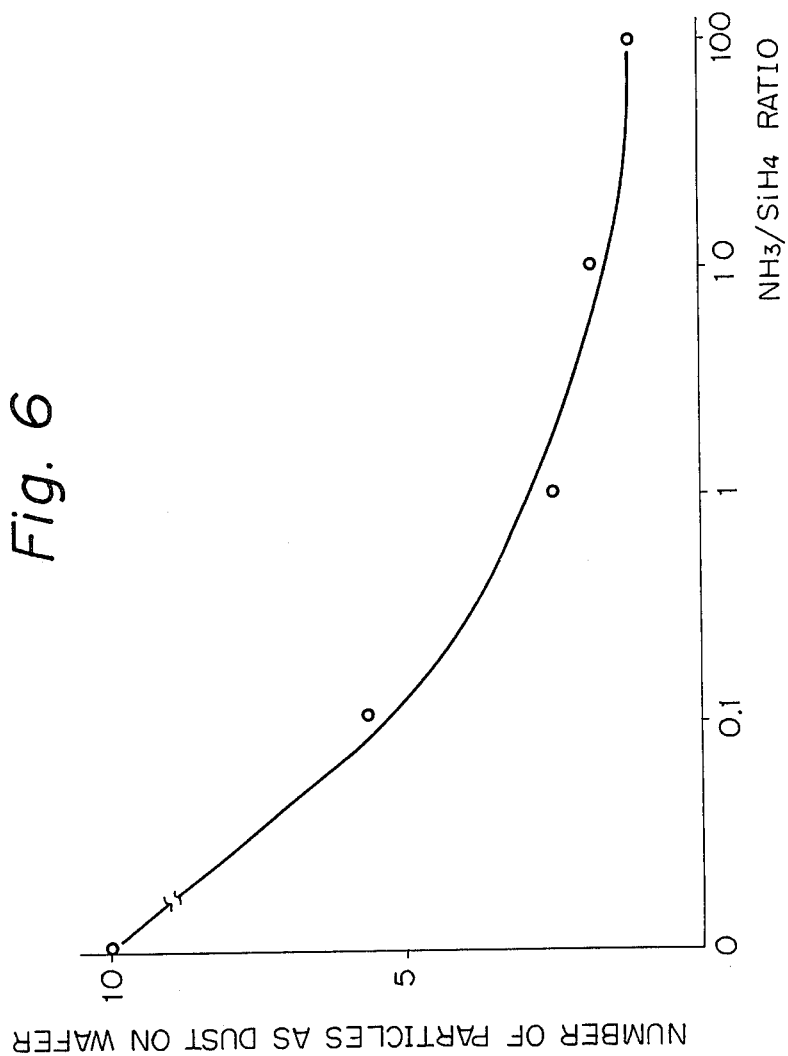

PROCESS FOR THE FORMATION OF PHOSPHOSILICATE GLASS COATING

BACKGROUND OF THE INVENTION

1. Field of the Invention

This invention relates to a chemical vapor deposition method. More particularly, this invention relates to a process for the formation of a coating of phosphosilicate glass on a substrate by a chemical vapor deposition method (hereinafter, referred to as "CVD" or "CVD" method. This phosphosilicate glass (phosphorus-doped silicon dioxide, P-glass, or PSG) coatings obtained by CVD are widely used in the production of semiconductor devices such as IC, LSI and VLSI circuits. These PSG coatings act as an electrical insulating layer between metals within the device, as a passivation layer which protects the device from the environment, and as a gettering source, for example.

2. Description of the Related Art

A variety of deposited films or coatings such as polycrystalline silicon (or polysilicon), silicon nitride, silicon dioxide, and phosphorus-doped silicon dioxide (PSG) are widely used in the fabrication of semiconductor devices, and among these coatings, PSG coatings are more frequently used because of their excellent properties. Generally, the PSG coatings are deposited on the substrate by using various CVD methods, and the CVD methods and reactions can be carried out under many different conditions.

In the formation of the PSG coating by CVD, a gaseous mixture of monosilane ($SiH_4$), phosphine ($PH_3$), and oxygen ($O_2$) is generally used as a reaction gas. The reaction gas is introduced into a reaction chamber to cause the following chemical reactions, thereby depositing the PSG coating:

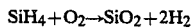

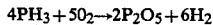

$SiH_4 + O_2 \rightarrow SiO_2 + 2H_2$ $4PH_3 + 5O_2 \rightarrow 2P_2O_5 + 6H_2$ The reactions can be carried out at atmospheric pressure or at a reduced pressure. The main advantage of these reactions is the low deposition temperature, lower than 500° C., which allows the resulting PSG coatings to be deposited over aluminum metallization. This advantage will be appreciated when it is understood that, since the PSG coatings as the insulating layer or as the passivation or covering layer are deposited on the substrate or wafer after the formation of the aluminum circuitries thereon, it is necessary to carry out the reactions at temperatures lower than the melting point of aluminum, i.e., 660° C., in order to avoid fusion of the aluminum circuitries. Generally, the above CVD reactions are referred to as a low-temperature CVD.

More particularly, hitherto, the PSG coating as an insulating layer has been deposited on the substrate or wafer surface by using a hot-wall, reduced-pressure CVD reactor, as shown in FIG. 1 for example. The CVD reactor of FIG. 1 has a reaction chamber 1 in the form of a quartz tube provided with two gas inlet tubes 2 and 3 and a gas exhaust tube 4. A gaseous mixture of $SiH_4$ and $PH_3$ is introduced through the inlet tube 2 into the reaction chamber 1, and oxygen gas is introduced therein through the inlet tube 3. Wafers 5 on which the PSG coating is deposited by CVD are stood vertically, perpendicular to the gas flow, in a basket 6. The reaction chamber 1 is heated with a heater 7 surrounding the chamber 1. Pressures in the chamber 1 are maintained in the range of from a reduced pressure of about 0.01 Torr to atmospheric pressure by controlling a reduced pressure exhaust system (not shown) connected with the exhaust tube 4. 0.2 Torr is maintained in the chamber 1.

The reaction gases are introduced into the reaction chamber at different flow rates. The flow rates of ($SiH_4 + PH_3$) mixed gas and $O_2$ gas depend on various factors, such as the size of the chamber, number of wafers to be disposed in the chamber, and the like. The reaction gases are heated and reacted in the chamber while maintained at temperatures of from 300 to 450° C.

An atmospheric-pressure CVD process also has been used for the formation of the PSG coating. The atmospheric-pressure CVD process can be carried out in the reactor shown in FIG. 2, for example. A reaction chamber 11 has a susceptor 9 on which a wafer 15 is positioned, and which is heated to temperatures of from 300° C. to 450° C. with the attached heater 10. A reaction gas consisting of $SiH_4$, $PH_3$ and $O_2$ is introduced through a gas feed pipe 12 and a gas outlet 8 provided with orifices, in sequence, into the reaction chamber 11. After the CVD reaction is completed, the used gas is discharged through gas exhaust pipes 13 and 14.

The above-discussed reduced-pressure and atmospheric-pressure CVD processes can provide the PSG coatings having many advantages, such as a uniform and highly oriented coating, good electrical properties, and excellent resistance to the environment, but suffer from two serious problems. As is well known in the art, one problem is poor step coverage, and another is particles of the by-products produced during the CVD reactions, because the particles adhere to the wafer surface and thus wafers are unacceptable for use.

In the formation of the PSG coating by CVD, the following reactions are generated:

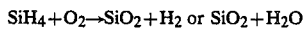

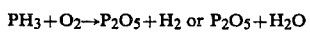

$SiH_4 + O_2 \rightarrow SiO_2 + H_2$ or $SiO_2 + H_2O$ $PH_3 + O_2 \rightarrow P_2O_5 + H_2$ or $P_2O_5 + H_2O$ As a result, $SiO_2$ is grown on the wafer, and $P_2O_5$ is doped into the growing $SiO_2$ layer to form the PSG coating. However, during these reactions, $SiO_2$, $P_2O_5$, $H_2SiO_3$, and similar products (hereinafter referred to as by-products) are formed and deposited on the end portions or outlets of the gas inlet tubes, and these by-products give the following disadvantages.

Namely, referring now to FIG. 1, the problem of the particles of the by-products is caused in end portions of each of gas inlet tubes 2 and 3. Unavoidably, some of these by-products are formed and deposited in the end portions of the inlet tubes and the deposited by-products are sometimes dislodged and the particles thereof adhere as dust on the wafer surface. In addition, the by-products deposited on the outlets of the inlet tubes cause variations in the amount of gases introduced into the reaction chamber, thereby adversely affecting the uniform growth of the PSG coatings on the wafer.

Similar disadvantages also arise in the CVD reactor illustrated in FIG. 2. It was found that during the CVD reactions in the reactor, by-products such as $SiO_2$, $P_2O_5$ and $H_2SiO_3$ are formed and deposited on the orifice-side surface of the gas outlet 8 and particles thereof are sometimes dislodged and adhere to the surface of the wafer 15 opposite the gas outlet 8. Experiments by the present inventors showed that about ten particles of the by-products, having a diameter of 1 μm were adhered to a wafer having a diameter of 10 cm (4 inches).

In U.S. Pat. No. 4,625,678 issued Dec. 2, 1986, assigned to Fujitsu Limited, Shioya et al teach a plasma CVD apparatus for forming a deposited film such as silicide or metal film on a base body, which includes a gas feeding pipe and a heating device capable of heating at least a part of the gas feeding pipe inside the reaction chamber, thereby preventing the gas from condensing or solidifying. The heating of the gas feeding pipe as taught by Shioya et al can provide satisfactory results, and similar results cannot be obtained in the prior art CVD methods discussed above, because there are essential differences in the solidification or particle deposition mechanism of these CVD methods. In the prior art CVD methods discussed in the U.S. patent, a problem arose in that a reaction gas maintained at a high temperature is condensed and solidified immediately after introduction into a reaction chamber, due to a sudden reduction of the temperature thereof.

SUMMARY OF THE INVENTION

An object of this invention is to provide an improved process for forming a PSG coating by using the CVD method, in which the problem of the formation of the by-product particles discussed above does not occur, and a satisfactory step coverage is obtained.

According to this invention, there is provided a process for the formation of PSG coatings on a substrate by the CVD method, in which a reaction gas consisting of monosilane ($SiH_4$), phosphine ($PH_3$), and oxygen ($O_2$) is introduced into a reaction chamber in admixture with ammonia ($NH_3$) gas.

In the practice of this invention, the three types of gases used as components of the reaction gas may be introduced into the reaction chamber separately or in combination, and all or part of the gas flows may contain $NH_3$ gas.

A volume ratio of $NH_3$ gas to $SiH_4$ gas in the reaction gas can be widely varied, depending upon the results desired. However, to attain the best results, preferably the $NH_3/SiH_4$ ratio is within the range of from 0.1 to 100. Further, preferably the CVD reactions of this invention are carried out at temperatures of from 300° C. to 450° C. The process according to this invention can be used in the production of semiconductor devices such as IC, LSI and VLSI circuits, and the resulting PSG coatings are effective as an electrical insulating layer, a passivation layer, as a gettering source, and the like.

BRIEF DESCRIPTION OF THE DRAWINGS

FIG. 4 is a graph comparing the deposition rate of the PSG coating of the process according to this invention with that of the prior art process;

FIG. 5 is a graph showing a relationship between the deposition rate of the PSG coating and the $NH_3/SiH_4$ ratio;

FIG. 6 is a graph showing a relationship between the number of the particulate by-products distributed on the wafer surface and the $NH_3/SiH_4$ ratio; and, FIGS. 7A and 7B are cross-sectional views of the PSG coating deposited on Al comparing the step coverage of the process according to this invention with that of the prior art process.

DESCRIPTION OF THE PREFERRED EMBODIMENTS

Figure 3:
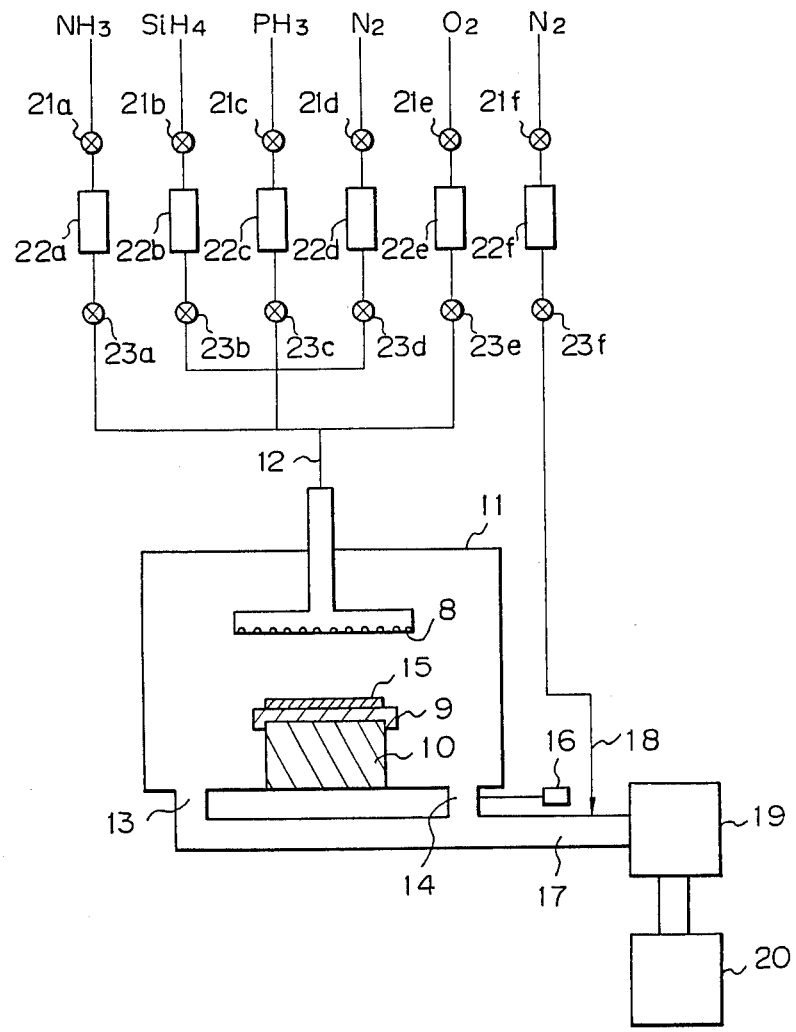
FIG. 3 is a schematic view of the atmospheric-pressure CVD reactor according to this invention.

FIG. 3 shows an atmospheric-pressure CVD reactor suitable for carrying out the process of this invention, in which 11 is a reaction chamber, 8 is a gas outlet with orifices, 15 is a wafer, 9 is a susceptor, 10 is a heater, 21a to 21f are valves, 22a to 22f are mass flow controllers, 23a to 23f are valves, 16 is a vacuum gauge, 19 is a mechanical pump, and 20 is a rotary pump. The CVD reactor is designed to carry out a deposition of the PSG coating on the wafer in accordance with the low-temperature CVD method and by using a reaction gas ($SiH_4 + PH_3 + O_2$).

The operation of the CVD reactor of FIG. 3 is as follows. $SiH_4$ gas, $PH_3$ gas and $N_2$ gas are fed through the valves 21b, 21c, and 21d, the mass flow controllers 22b, 22c and 22d, and the valves 23b, 23c and 23d, respectively. The addition of $N_2$ gas is not essential to the process of this invention, but in the illustrated CVD method, $N_2$ gas is introduced into the reaction chamber to control the progress of the reaction. These gas flows are then combined, and to the combined gas flow are added $NH_3$ gas which is supplied through the valve 21a, the mass flow controller 22a, and the valve 23a, and $O_2$ gas which is supplied through the valve 21e, the mass flow controller 22e, and the valve 23e. A mixture of the reaction gas thus obtained is then led through the feed pipe 12 to the gas outlet 8. The gas outlet 8 is maintained at a lower temperature than that of the wafer 15 on the susceptor 9, because the outlet 8 is farther away from the heater 10 for heating the wafer 15.

The CVD reactions are carried out in the reaction chamber 11. During the reactions, the chamber 11 is exhausted by the mechanical pump 19 and the rotary pump 20 connected in series. Exhaust ports 13 and 14 of the reaction chamber 11 are connected with the exhaust pipe 17, and the exhaust pipe 17 is connetted with the pump 19. The exhaust port 14 is provided with the vacuum gauge 16, which is used to observe the pressure and variations thereof in the chamber 11. $N_2$ gas is supplied from the feed pipe 18 to the exhaust pipe 16 positioned between the vacuum gauge 16 and the pump 19, to control the pressure in the chamber 11. Namely, the pressure in the chamber 11 can be controlled by controlling a flow rate of the $N_2$ gas supplied from the pipe 18, by changing the exhaust pressure of the system.

Figure 1:
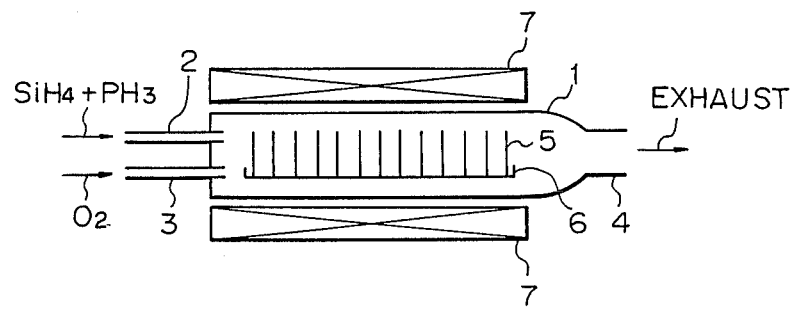
FIG. 1 is a schematic view of the prior art reduced-pressure CVD reactor.

Various experiments by the inventors, using the reactor of FIG. 1, showed that the addition of $NH_3$ gas into the reaction gas ($SiH_4+PH_3+O_2$) effectively prevented the formation of particulate by-products such as $SiO_2$, $P_2O_5$ and $H_2SiO_3$ and the adhesion thereof on the wafer surface, as well as a nonuniform deposition of the PSG coating due to the formation of by-products, and notably improved the step coverage. Similarly, satisfactory results were obtained when other types of CVD reactors such as a reduced-pressure reactor or the like were used instead of the reactor of FIG. 1.

The inventors could not ascertain the exact details of the mechanisms of the prevention of the formation of the particulate by-products and the improvement of the step coverage, but consider that, since the CVD reactions near the outlet 8 of the reaction gas are effectively inhibited because that area has a relatively low temperature—because it is remote from the heater—and because the reaction gas contains a suitable amount of inert NH$_3$ gas, undesirable formation of the particulate by-products is avoided. When the reaction gases approach the heated wafer, active CVD reactions occur because that area has a high temperature and the effect of the NH$_3$ gas on the CVD reactions is now negligible. In addition, it should be noted that, surprisingly, excellent effects could be obtained only with the use of NH$_3$ gas at a predetermined NH$_3$/SiH$_4$ ratio, but good results could not be obtained when other gases were added, such as CO$_2$, Ar and N$_2$O, to the reaction gas instead of NH$_3$ gas.

Figure 2:
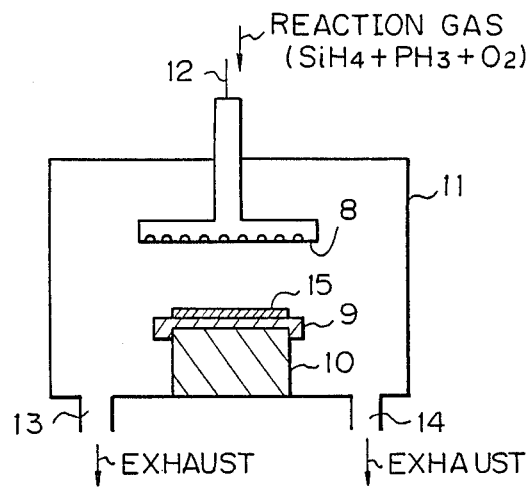
FIG. 2 is a schematic view of the prior art atmospheric-pressure CVD reactor.

Since undesirable particulate by-products were not produced near the outlets of the reaction gas, the reaction gas was uniformly guided to and subjected to the CVD reactions on the wafer surface. Accordingly, the uniform PSG coatings without defects were deposited on the wafer surface. The rate of deposition of the PSG coatings was stable (for example, 1000Å/min. for the CVD reactions in the reactor of FIG. 2) and higher than that of the prior art CVD reactions in which NH$_3$ gas was not introduced into the reaction gas.

FIG. 4 is a graph showing a relationship between the pressure (linear) in the reaction chamber and the rate of deposition of the PSG coating on the wafer surface. A solid line A indicates the rate for the process of this invention, in which NH$_3$ gas at an NH$_3$/SiH$_4$ ratio of 2 was introduced into the reaction gas (SiH$_4$+PH$_3$+O$_2$), and a dotted line B indicates the rate for the prior art process in which NH$_3$ gas was not added to the reaction gas. From this graph, it will be appreciated that, when NH$_3$ gas is not added to the reaction gas to be introduced into the reaction chamber, particulate by-products such as SiO$_2$, P$_2$O$_5$ and H$_2$SiO$_3$ are formed and deposited on the outlet portions of the reaction gas, from the following reactions:

$$SiH_4 + O_2 \rightarrow SiO_2 + H_2O (\text{or } H_2)$$

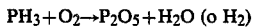

$$PH_3 + O_2 \rightarrow P_2O_5 + H_2O (\text{o } H_2)$$

These particles adversely affect the amount of the reaction gas to be supplied toward the wafer, thereby causing a reduction of the rate of deposition of the PSG coating. The rate of deposition of the PSG coating in this case is slower than that where NH$_3$ gas is added. In addition, the rate of deposition of the PSG coating is inversely proportional to the pressure in the reaction chamber.

In contrast, when NH$_3$ gas is added to the reaction gas before or during introduction of the same into the reaction chamber, the reaction gas is stably supplied into the chamber without adverse affects from the particulate by-products described above, because these by-products are not formed in the outlet portions of the reaction gas. As a result, a stable deposition of the PSG coating on the wafer surface can be attained.

A stable deposition of the PSG coating on the wafer could be obtained by adjusting a ratio of NH$_3$/(SiH$_4$+PH$_3$) to from 2 or 3 to 12 or 13 percents and an O$_2$/H$_4$ ratio to from 1.5 to 10, and by maintaining the pressure within the chamber at 0.2 Torr. In addition, only five or less particles having a diameter of about 1 μm were found as dust on a surface of the wafer having a size of 10 cm (4 inches).

FIG. 5 shows a dependency of the rate of deposition of the PSG coating upon the NH$_3$/SiH$_4$ ratio. The graph of FIG. 5 indicates that the rate of deposition of PSG is reduced when the NH$_3$/SiH$_4$ ratio is increased and, unexpectedly, the curves at 350° C. and 400° C. each have a threshold point from which the deposition rate is suddenly reduced. These are important factors when determining the conditions for carrying out the CVD methods according to this invention.

FIG. 6 shows a dependency of the number of particulate by-products (about 1 μm diameter) found on the wafer surface, upon the NH$_3$/SiH$_4$ ratio. From this graph, it will be appreciated that, to prevent the adhesion of the particulate by-products on the wafer surface, preferably NH$_3$ gas is added to the reaction gas so that the NH$_3$/SiH$_4$ ratio is within the range of from 0.1 to 100.

Figure 7A:
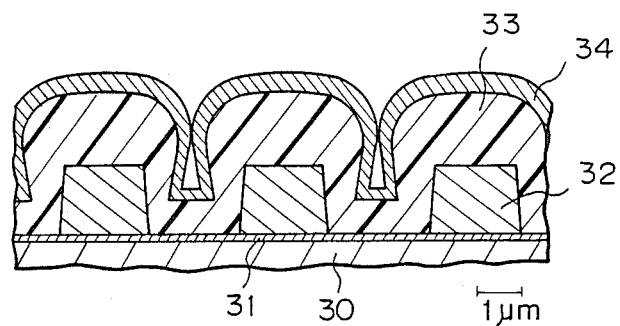
Figure 7B:
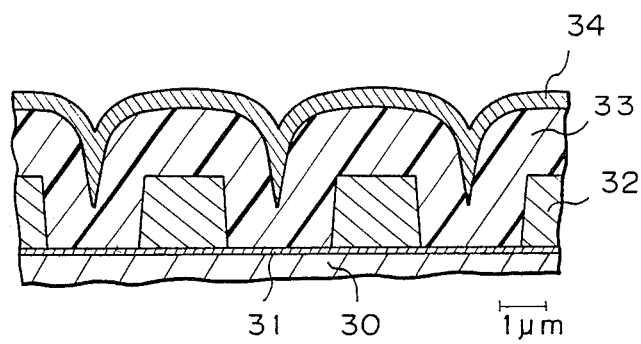

The improvement of the step coverage will be easily understood by referring to FIG. 7A (prior art) and FIG. 7B (this invention), in which 30 is a silicone (Si) wafer, 31 is an SiO$_2$ layer, 32 is an Al layer, 33 is a PSG coating, and 34 is a plasma SiN coating. When NH$_3$ gas is introduced into the reaction gas during the CVD process, the step coverage of the PSG coating can be remarkably improved. The results of these drawings as well as those of FIGS. 4 to 6 were obtained by using the CVD reactor illustrated in FIG. 3.

As described hereinabove in detail, according to the process of this invention, it is possible to diminish the number of particulate by-products adhered as dust on the wafer surface to a half or less, in comparison with the prior art CVD process for forming the PSG coatings. In addition, since a stable deposition of the PSG coatings can be attained, and the step coverage also can be improved, the process of this invention will effectively increase the yield in the production of the semiconductor devices. Further, the process of this invention was described with regard to a batch system, with reference to FIG. 3. In this system, even if the input and output of the wafers was carried out repeatedly and continuously, no particulate by-products were adhered on the wafer surface. Thus, a considerable reduction of the labor and time necessary for washing the chamber, and other work, can be realized.

We claim:

1. A process for formation of a coating of phosphosilicate glass on a substrate by a chemical vapor deposition method, in which a reaction gas consisting of monosilane, phosphine and oxygen is introduced into a reaction chamber in admixture with ammonia gas, said ammonia gas being present in the reaction gas in an amount sufficient to inhibit formation of particulate by-products but insufficient to interfere with the desired CVD reaction.

2. A process according to claim 1, in which the reaction gas-providing gases are introduced separately or in combination into the reaction chamber.

3. A process according to claim 1 or 2, in which a volume ratio of ammonia gas to monosilane gas in the reaction gas is within the range of from 0.1 to 100.

4. A process according to of claim 1 in which the chemical vapor deposition reactions are carried out at a temperature of from 300 to 450° C.

5. A process according to claim 1 which is used in the production of semiconductor devices.

6. A process according to claim 2, in which the chemical vapor deposition reactions are carried out at a temperature of from 300 to 450° C.

7. A process according to claim 3, in hich the chemical vapor deposition reactions are carried out at a temperature of from 300 to 450° C.

8. A process according to claim 2 which is used in the production of semiconductor devices.

9. A process according to claim 3 which is used in the production of semiconductor devices.

10. A process according to claim 4 which is used in the production of semiconductor devices.

11. A process according to claim 6 which is used in the production of semiconductor devices.

12. A process according to claim 7 which is used in the production of semiconductor devices.

* * * * *

UNITED STATES PATENT AND TRADEMARK OFFICE
CERTIFICATE OF CORRECTION

PATENT NO. : 4,781,945

DATED : November 1, 1988

INVENTOR(S) : Masahide Nishimura, Kanetake Takasaki, Kenji Koyama, Atsuhiro Tsukune It is certified that error appears in the above-identified patent and that said Letters Patent is hereby corrected as shown below:

Column 5, line 39, "$H_2O(or\ H_2)$" should be --$H_2O\ (or\ H_2)$--;

line 40, "$(o\ H_2)$" should be --$(or\ H_2)$--.

Signed and Sealed this

Eleventh Day of April, 1989

Attest:

DONALD J. QUIGG

Attesting Officer

Commissioner of Patents and Trademarks